United States Patent
Liu et al.

(10) Patent No.: US 6,762,118 B2
(45) Date of Patent: Jul. 13, 2004

(54) PACKAGE HAVING ARRAY OF METAL PEGS LINKED BY PRINTED CIRCUIT LINES

(75) Inventors: Wen-Chun Liu, Kaohsiung (TW); Chien-Hung Lai, Kaohsiung (TW)

(73) Assignee: Walsin Advanced Electronics Ltd., Kaohsiung (TW)

( * ) Notice: Subject to any disclaimer, the term of this patent is extended or adjusted under 35 U.S.C. 154(b) by 114 days.

(21) Appl. No.: 10/084,810

(22) Filed: Feb. 25, 2002

(65) Prior Publication Data

US 2002/0089053 A1 Jul. 11, 2002

Related U.S. Application Data

(62) Division of application No. 09/686,478, filed on Oct. 10, 2000, now abandoned.

(51) Int. Cl.[7] .............................................. H01L 21/44
(52) U.S. Cl. ...................... 438/613; 438/15; 438/106; 438/112; 438/121; 438/124; 438/612; 257/666; 257/678; 257/738
(58) Field of Search ..................... 438/15, 613, 106, 438/112, 121, 124, 612, 14, 107, 614, 110, 111; 257/666, 678, 738, 676, 692, 693, 697, 701, 707, 736, 739, 775

(56) References Cited

U.S. PATENT DOCUMENTS

| 5,656,550 A | * | 8/1997 | Tsuji et al. |
| 5,807,610 A | * | 9/1998 | Cox et al. |
| 6,025,640 A | * | 2/2000 | Yagi et al. |
| 6,380,062 B1 | * | 4/2002 | Liu |

* cited by examiner

Primary Examiner—Wael Fahmy
Assistant Examiner—DiLinh Nguyen
(74) Attorney, Agent, or Firm—J.C. Patents

(57) ABSTRACT

An integrated circuit package structure having an array of metal pegs connected by printed circuit lines. The package includes a die pad having a die positioned above and an area array distribution of external metal pegs surrounding the die. The package also contains a plurality of internal metal pegs that surround the die. These internal pegs are electrically connected to the bonding pads on the die via conductive medium. The die pad, the die, the conductive medium and the internal pegs are all enclosed by an insulating material. The bottom side of the die pad is exposed while the external metal pegs are electrically connected to various internal metal pegs using printed circuit lines. Furthermore, an electroplate layer is also formed on the end face of each metal peg.

13 Claims, 9 Drawing Sheets

PACKAGE HAVING ARRAY OF METAL PEGS LINKED BY PRINTED CIRCUIT LINES

This application is a divisional application of, and claims the priority benefit of, U.S. application Ser. No. 09/686,478 filed on Oct, 10, 2000, now abandoned.

BACKGROUND OF THE INVENTION

1. Field of Invention

The present invention relates to a semiconductor package structure and its method of manufacture. More particularly, the present invention relates to a package structure having an array of metal pegs each linked by a printed circuit line to a silicon chip.

2. Description of Related Art

In the semiconductor industry, integrated circuits (ICs) are generally manufactured in three separate stages. First, the semiconductor substrates or silicon wafers are formed using an epitaxial technique. Next, various semiconductor devices such as MOS transistors and multi-level interconnects are formed in the semiconductor substrate. Finally, the silicon wafers are diced up to form separate dies and then packaged. The purpose of packaging is to provide the necessary protection of the die and the connection to a printed circuit board (PCB) or other electrical component.

Usually, for an IC module, a large number of connections are necessary to link up a die. Consequently, hundreds of circuit lines are needed to complete the connections. In conventional packages, a lead frame is used to connect the bonding pads on a die with external contact points outside the package. Due to the rapid increase in the level of integration of integrated circuits without a corresponding increase in size of the package, the conventional lead frame type of package is simply overwhelmed by the number of conductive wires necessary for connection. In addition, electronic products must get lighter, thinner, shorter and smaller with each upcoming generation so that they can be competitive in the marketplace. Hence, new types of packaging techniques such as chip scale package, chip size package and multi-chip module have been developed.

Nowadays, techniques for manufacturing integrated circuits having a line width smaller than 0.18 microns is available. With many breakthroughs in the level of circuit integration, the size of a package has to be minimized as well.

A conventional package uses a lead frame as a die carrier with leads protruding from the side of the package. Because these leads are distributed around the edges of the package, the package has to occupy a larger area. Furthermore, the high lead count limits the distance of separation between neighboring leads or alternatively sets up a lower boundary for the minimum area of a package. Consequently, area array package structures are invented. The contact points of an area array package are usually laid on the bottom surface of the package. For example, ball grid array (BGA), small outline no-lead (SON) and ball chip carrier (BCC) are all area array packages.

FIGS. 1A through 1E are cross-sectional views showing the progression of manufacturing steps in fabricating a conventional ball grid array type of die carrier package. First, as shown in FIG. 1A, a photoresist material is deposited over surfaces 102a and 102b of a copper substrate 100 to form photoresist layers 104a and 104b, respectively. Next, the photoresist layer 104a is exposed and developed to form ball lead areas 106 that expose a portion of the surface 102a of the copper substrate 100.

Next, as shown in FIG. 1B, a wet etching operation is conducted, etching the copper substrate 100 using the photoresist layers 104a and 104b as a mask, thereby forming hemispherical cavities 108 in the ball lead areas 106. Thereafter, an electroplating operation is carried out to form a layer of metallic film 110 over the surface of the hemispherical cavities 108.

Next, as shown in FIG. 1C, both photoresist layers 104a and 104b are removed, and then a die 112 is bonded onto the surface 102a. After that, metallic wires 114 are bonded using a wire bonding machine, thereby linking the bonding pads (not shown in the figure) on the die 112 with the metallic film 110 inside the cavities 108 (FIG. 1B).

Next, as shown in FIG. 1D, the upper surface 102a of the copper substrate 100 is sealed off using plastic material such as epoxy 116. The epoxy 116 encloses the die 112, the metallic wires 114 and the metallic film 110 inside the cavity 108 (FIG. 1B).

Next, as shown in FIG. 1E, another wet etching operation is carried out to remove the copper substrate 100 entirely (portions labeled 100 in FIG. 1D). Ultimately, the hemispherical metal films 110, the bottom portion of the die 112 and the epoxy 16 are all exposed forming a complete ball grid array type of die carrier package. This type of die carrier package utilizes the hemispherical metallic films 110 as leads for connecting with external circuits.

However, the aforementioned die carrier package has intrinsic reliability problems as well as production yield problems. Since the package uses a metallic film that is made using precious metal as a connecting lead, the metallic film must not be too thick. Yet, saving metal in plating the metallic film makes the film vulnerable to scratches or peelings during transition or transportation. Too much damage to the metallic film is liable to cause a bad connection with a printed circuit board and may ultimately lead to reliability problems when the package is finally mounted using surface mount technology (SMT). Consequently, product yield decreases.

In light of the foregoing, there is a need to provide a method for manufacturing a better type of area array package.

SUMMARY OF THE INVENTION

Accordingly, the purpose of the present invention is to provide a type of package with an array of metal pegs connected by printed circuit wires. The metal pegs can be arranged to form an area array serving as contact points of the package. This type of package structure has a smaller overall thickness. Furthermore, bottom of the die pad is exposed so that heat can be dissipated from the die more readily. Furthermore, the end face of the metal pegs is electroplated so that the metal pegs can have good bondability, molding compound characteristic and solderability.

The invention also provides a method of forming a package structure having an array of metal pegs connected by printed circuit lines. The method is capable of producing high yield and high reliability packages such that surface mount technology can be readily applied.

To achieve these and other advantages and in accordance with the purpose of the invention, as embodied and broadly described herein, the invention provides a package structure having an array of metal pegs connected by printed circuit lines. Structurally the package includes a die pad having a silicon die on top. The underside of the package contains a plurality of external metal pegs arranged to form an area array. Surrounding the die near the edge of the package is a number of internal metal pegs that are electrically connected to various bonding pads on the die. The die, the die pad, and the internal metal pegs are all sealed off using insulating material so that only the bottom portion of the die pad is exposed. Each external metal peg can be electrically connected to an internal metal peg via a printed circuit line. Moreover, the end face of each internal or external metal peg contains an electroplate layer.

In another aspect, this invention provides a method for forming a package having an array of metal pegs connected by printed circuit lines. The method includes the steps of providing a metal substrate, and then forming electroplated layers in the metal peg areas on both the upper and lower surface of the metal substrate. Next, photoresist layers are formed on the upper and lower surface of the metal substrate. The photoresist layers cover the non-electroplated area on the lower surface of the metal substrate as well as the desired area for forming die pad on the upper surface of the metal substrate. Thereafter, the upper surface of the metal substrate is etched to remove a portion of the substrate material to form a die pad and internal metal pegs. After removing the photoresist layers, a silicon die is attached to the die pad. Then, electrical connections are made between the die and the internal metal pegs. Subsequently, insulating material is used to seal off the die, the die pad and the internal metal pegs. Next, a circuit line mask is formed inside the printed circuit line region on the lower surface of the metal substrate. Then, an etching operation is conducted to expose a portion of the insulating material and the bottom part of the die pad as well as to form external metal pegs and printed circuit lines. Each printed circuit line is used as a medium for linking each internal metal peg to an external metal peg.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
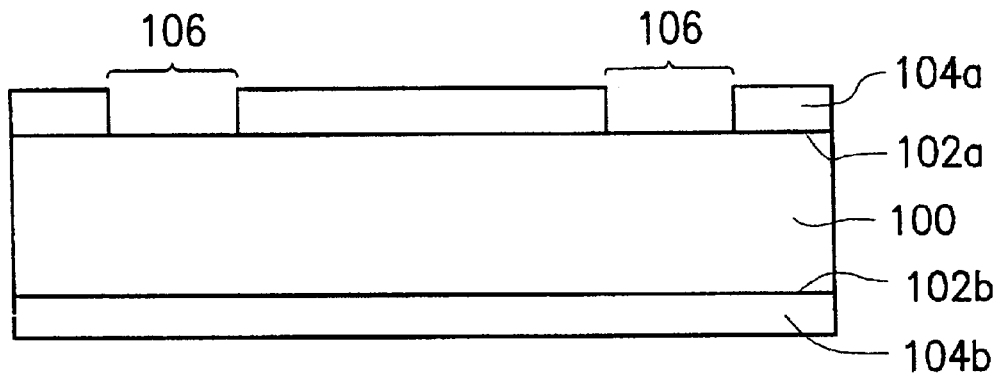
FIGS. 1A through 1E are schematic, cross-sectional views showing the progression of manufacturing steps for fabricating a conventional ball grid array type of die carrier package.
Figure 1B:
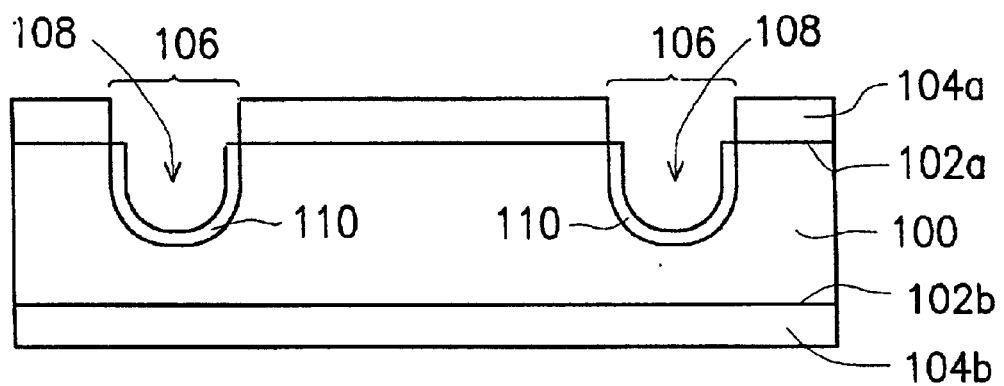
Figure 1C:
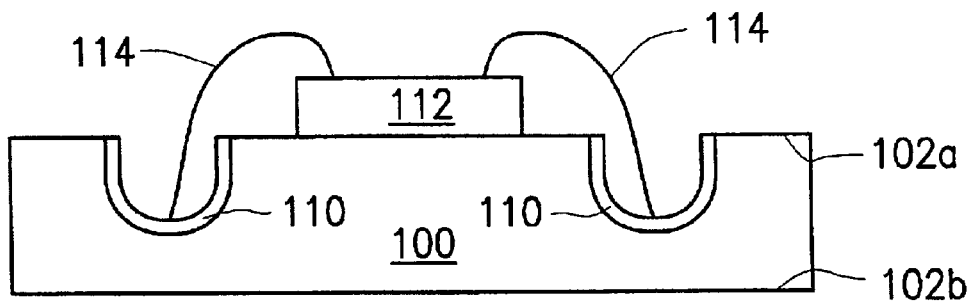
Figure 1D:
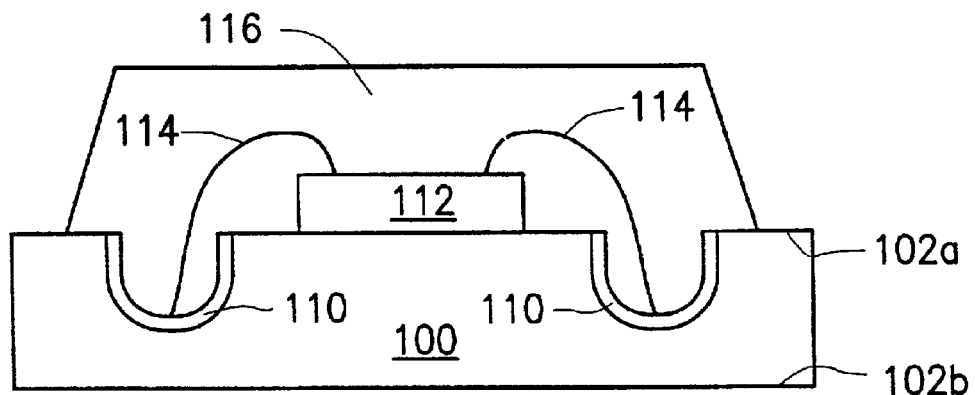
Figure 1E:
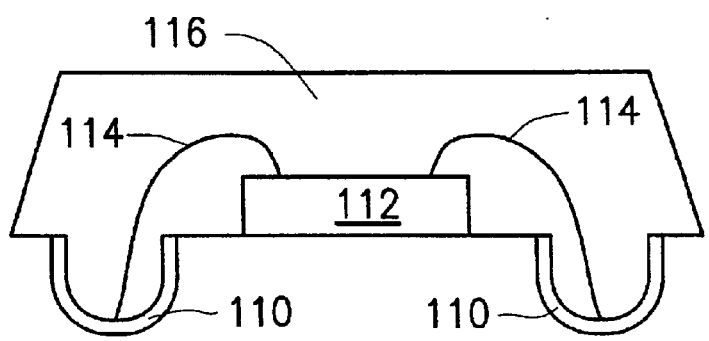

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2I are schematic, cross-sectional views showing the progression of manufacturing steps in fabricating a package structure having an array of metal pegs connected by printed circuit lines according to the preferred embodiment of this invention.

Figure 2A:
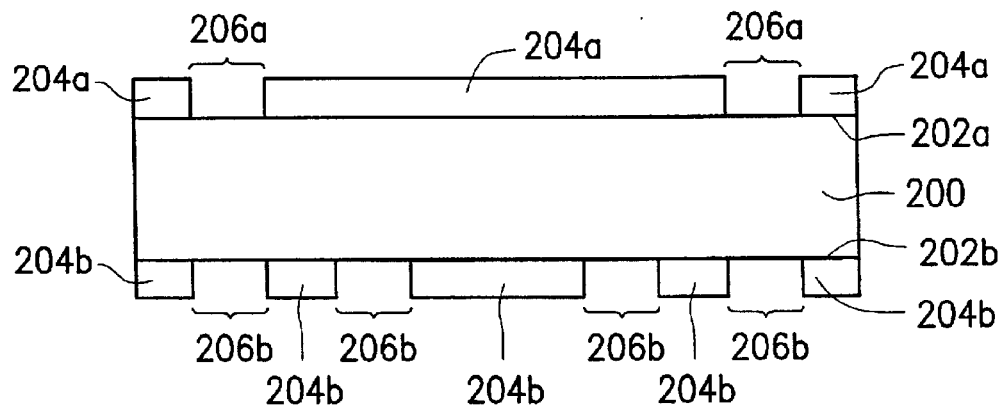
FIGS. 2A through 2I are schematic, cross-sectional views showing the progression of manufacturing steps for fabricating a package structure having an array of metal pegs connected by printed circuit lines according to the preferred embodiment of this invention.

First, as shown in FIG. 2A, a metal substrate 200 is provided. The metal substrate 200 can be made from material including copper, iron, copper alloy (C151, C194, C7025, KCF125 or EFTEC) or nickel-iron alloy (Ni—Fe 42 alloy). Next, a layer of photoresist is coated on the first surface 202a and the second surface 202b of the metal substrate 200. After exposure and development of the photoresist layer in photolithographic operations, a first photoresist pattern 204a is formed in a metal peg region 206a on the surface 202a of the metal substrate 200. Similarly, a second photoresist pattern 204b is formed in another metal peg region 206b on the surface 202b of the metal substrate 200.

Figure 2B:
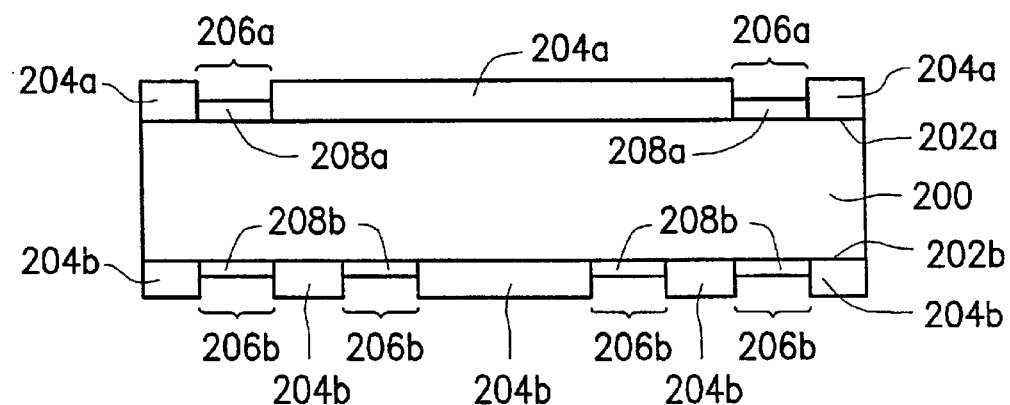

As shown in FIG. 2B, electroplating is carried out to form electroplate layers 208a in the metal peg region 206a and electroplate layers 208b in the metal peg region 206b of the metal substrate 200. The electroplate layers 208a and 208b can be made from material including gold (Au), silver (Ag), nickel (Ni), palladium (Pd), nickel-palladium alloy (Ni—Pd alloy) or a composite layer composed of a combination of different materials. Preferably, the electroplate layer is formed by first plating a layer of nickel, then plating a layer of nickel-palladium layer on top, and finally plating a layer of palladium. The purpose of having a nickel layer is to prevent corrosion, and the purpose of having a palladium layer is to enhance bondability, molding compound characteristic and solderability.

Figure 2C:
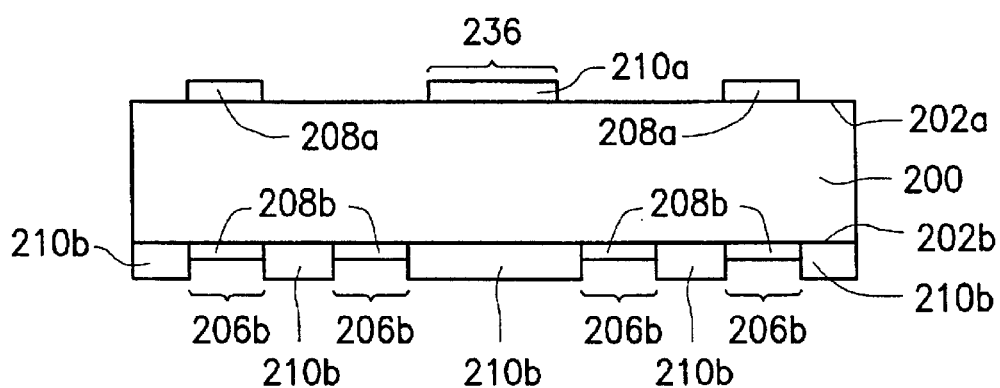

As shown in FIG. 2C, the photoresist layers 204a and 204b are removed. Thereafter, photoresist material is again deposited over the surfaces 202a and 202b of the metal substrate 200. After the photoresist material is exposed and developed, patterned photoresist layers 210a and 210b are formed. The photoresist layer 210b on the surface 202b covers the area not protected by the electroplate layers 206b. The photoresist layer 210a on the surface 202a, on the other hand, covers and thus marks out the desired die pad area 236.

Figure 3A:
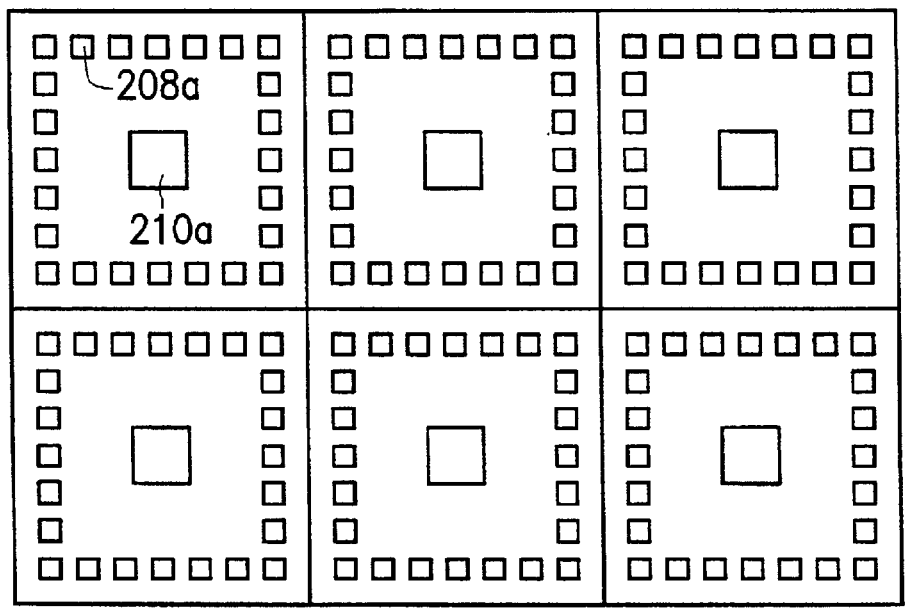
FIGS. 3A and 3B are the respective top and bottom schematic views of the metal substrate half-way into the steps required to form the package structure according to the method of this invention.
Figure 3B:
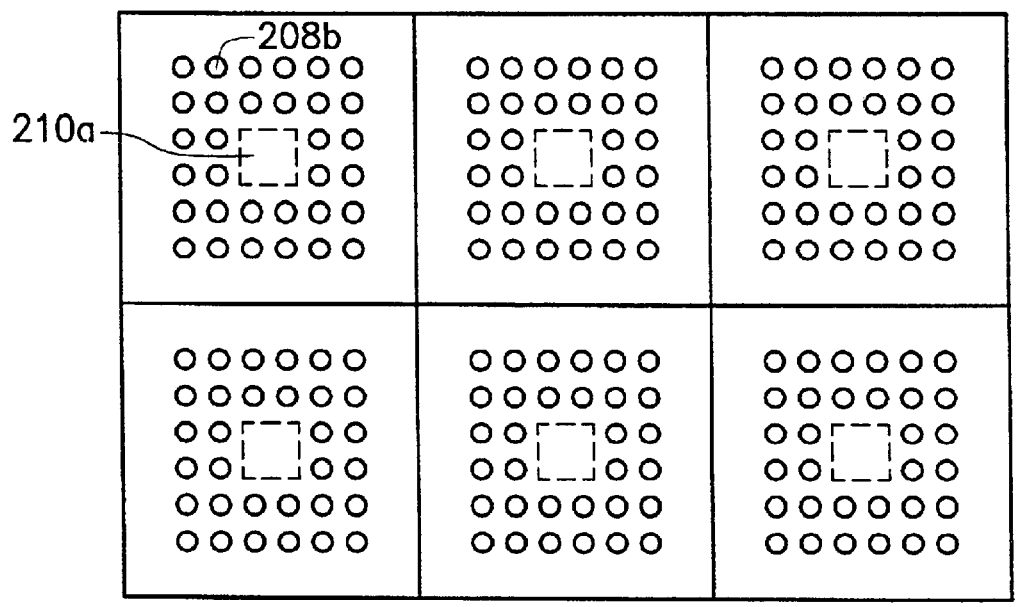

FIGS. 3A and 3B are the respective top and bottom views of the metal substrate half-way into steps required to form the package structure according to the method of this invention. As shown in FIGS. 3A and 3B, a number of packages can be produced simultaneously on the same piece of metal substrate. FIG. 3A is a top view of the metal substrate, which is the same view seen when looking at the surface 202*a* in FIG. 2C. The photoresist layer 210*a* over the die pad area is located in a central position, and the electroplate layers 208*a* are located in the region that surrounds the die pad area. FIG. 3B is a bottom view of the metal substrate, which is the same view seen when looking at the surface 202*b* in FIG. 2C. The electroplate layers 208*b* are arranged to form an area array pattern on the surface 202*b*. The remaining areas on the surface 202*b* not covered by the electroplate layers 208*b* are covered by the photoresist layer 210*b*.

Each electroplate layer 208*a* shown in FIG. 3A is rectangular, but each electroplate layer 208*b* shown in FIG. 3B is circular. These particular shapes are chosen for illustration only. In fact, the electroplate layers 208*a* and 208*b* can be fabricated into any convenient geometric shape.

Figure 2D:
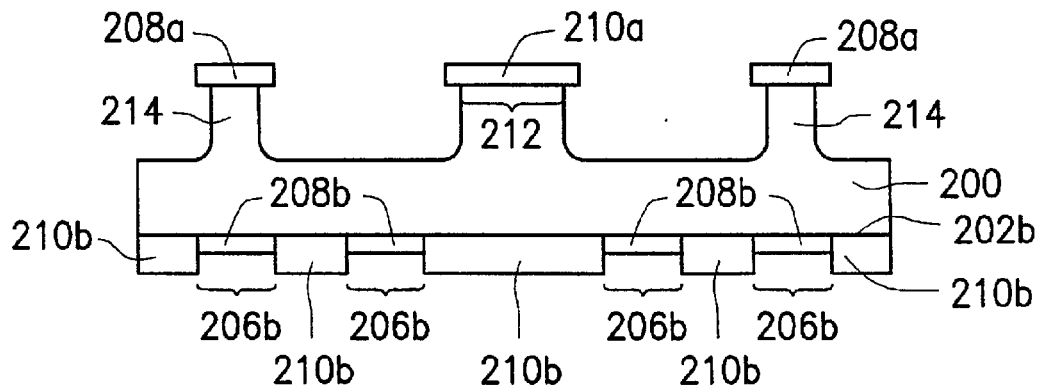

As shown in FIG. 2D, using the photoresist layers 210*a* and 210*b* as well as the electroplate layers 208*a* and 208*b* as an etching mask, a half-etching operation is carried out. During the half-etching operation, a portion of the metal substrate material on the portion of the surface 202*a* is removed to form a die pad 212 and a number of metal pegs 214 in the surrounding area.

Figure 2E:
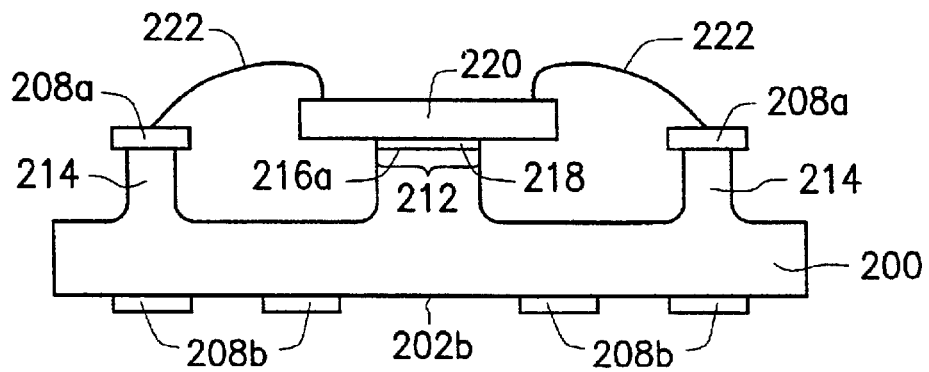

As shown in FIG. 2E, the photoresist layers 210*a* and 210*b* are removed. Thereafter, a silicon die is attached to the die pad 212 and then electrical connection is made between the metal pegs 214 and the bonding pads on the die. The die 220 can be fixed onto the upper surface 216*a* of the die pad 212 using bonding material 218 such as insulating glue, conductive glue or tapes. Electrical connections between the electroplate layer 208*a* on the metal pegs 214 and bonding pads (not shown) on the die can be made using conductive wires 222, for example, in a wire bonding machine. The conductive wires 222, for example, can be gold or aluminum wires.

Figure 4:
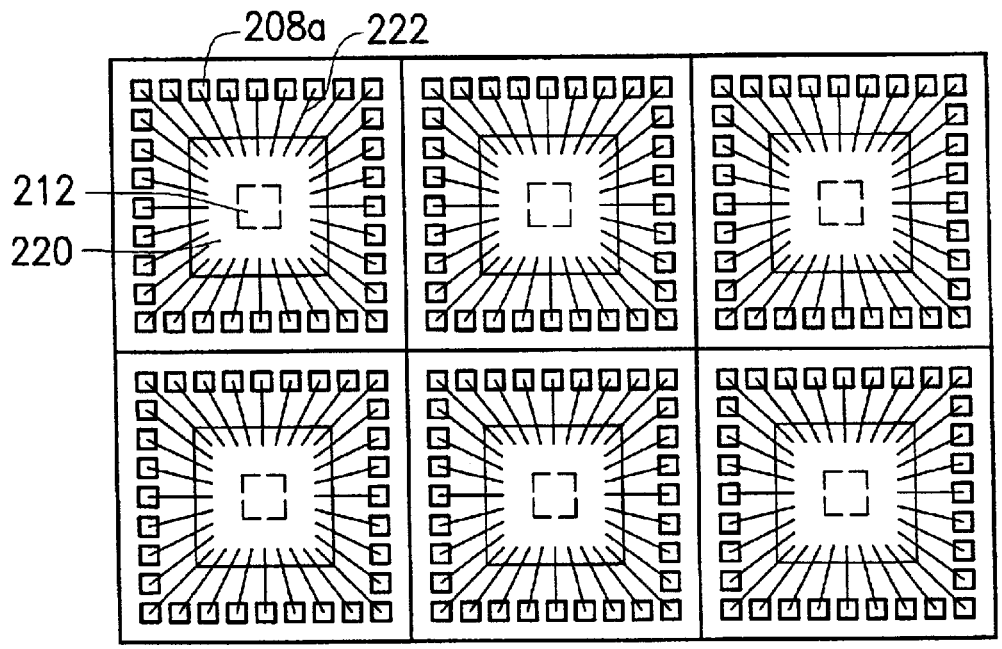
FIG. 4 is a schematic, top view showing a die attached to a die pad of the metal substrate and wire bonded to internal metal pegs according to the method of forming the package structure in this invention.

FIG. 4 is a top view showing a die attached to a die pad of the metal substrate and wire bonded to internal metal pegs according to the method of forming the package structure in this invention. As shown in FIG. 4, the die pad 212 for carrying the die 220 has an area smaller than the die 220. The connection between each bonding pad on the die 220 and each electroplate layer 208*a* is made by bonding conductive wires 222 such as gold or aluminum wires using a wire bonding machine.

Figure 2F:
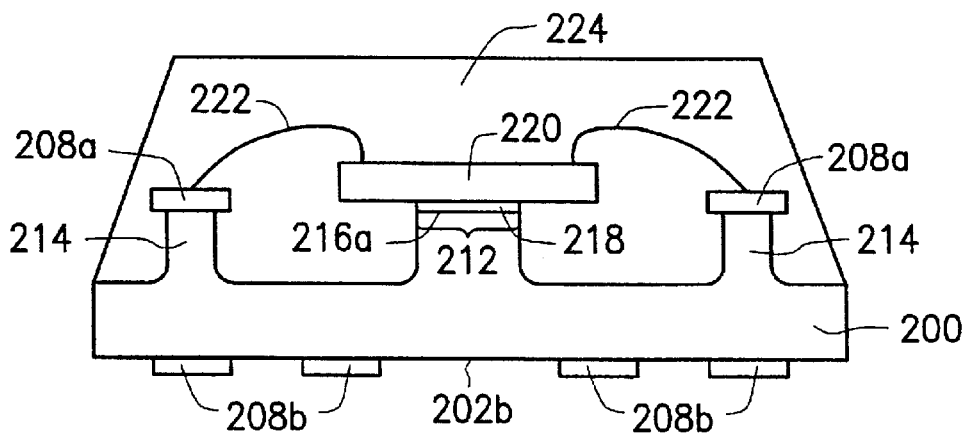

As shown in FIG. 2F, a molding operation is carried out to enclose the silicon die 220, the die pad 212, the conductive wires 222 and the metal pegs 214 with insulating material 224. The insulation material 224 can be resin or epoxy. The molding operation is carried out only on the surface 202*a* of the metal substrate 200, and so the surface 202*b* is free of the insulation material 224.

Figure 2G:
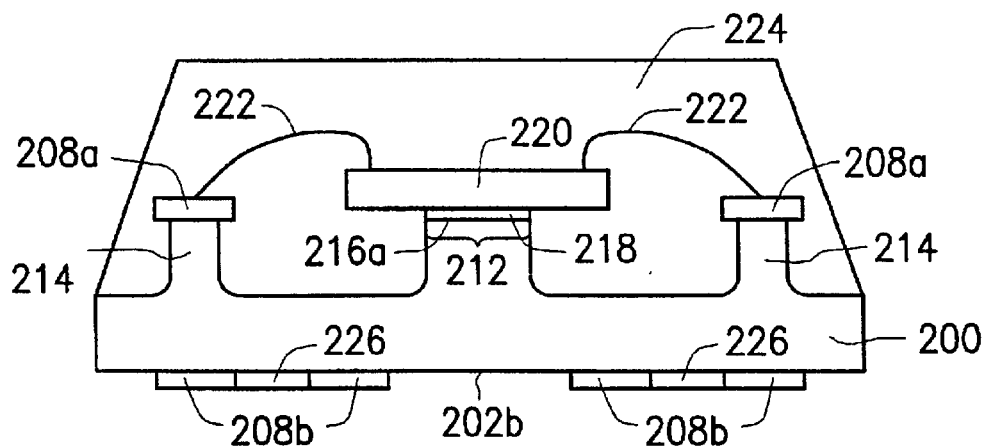

As shown in FIG. 2G, a circuit line mask 226 is formed on the surface 202*b* of the metal substrate 200. The circuit line mask 226 is formed using, for example, a screen printing process. The screen printing process includes spreading insulating paint over the desired trace line area, then baking the paint so that it hardens, and finally obtaining an insulating paint layer with a circuit line mask 226. The paint includes any thermally hardened type of insulating paint.

Figure 5:
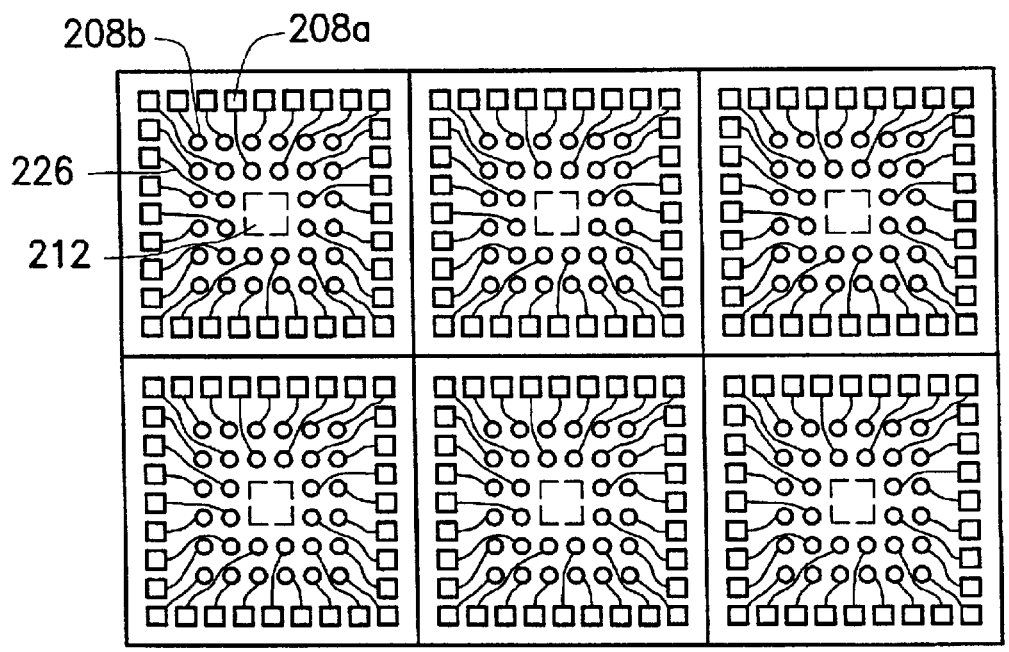
FIG. 5 is a schematic, top view of the lower surface of the package according to this invention after a circuit line mask is formed over the metal substrate for a first type of external metal peg arrangement.

FIG. 5 is a top view of the lower surface of the package according to this invention after a circuit line mask is formed over the metal substrate for a first type of external metal peg arrangement. As shown in FIG. 5, the circuit line mask 226 serves as a mask for forming printed circuit lines on the final package. The printed circuit lines are the necessary media for electrically linking together the electroplate layers 208*a* and the electroplate layers 208*b*.

Figure 6:
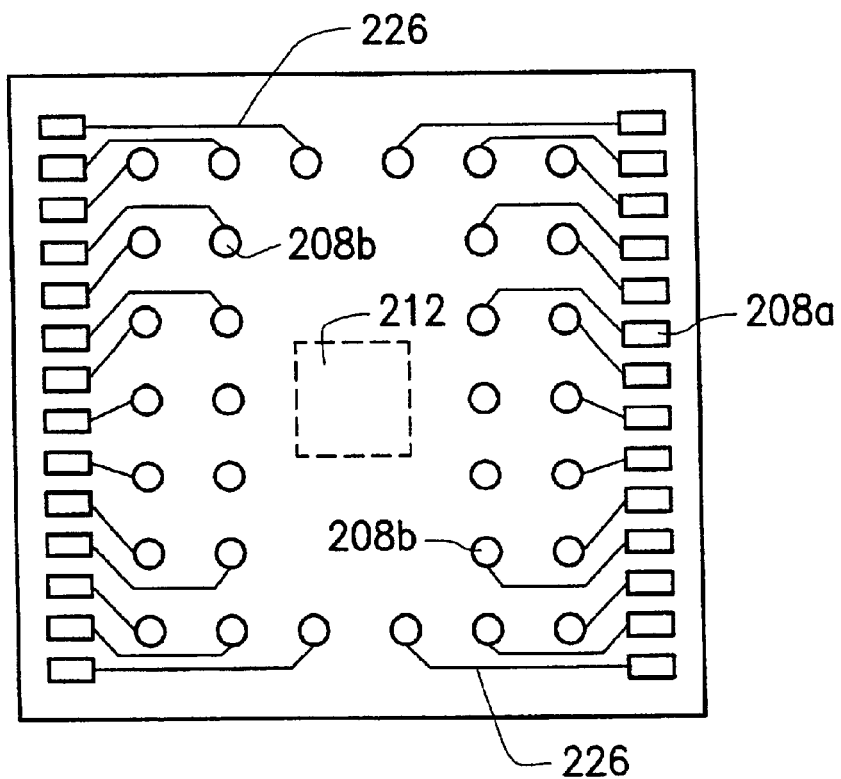
FIG. 6 is a schematic, top view of the lower surface of the package according to this invention after a circuit line mask is formed over the metal substrate for a second type of external metal peg arrangement.

As shown in FIGS. 4 and 5, the electroplate layers 208*a* are distributed around the die. The electroplate layers 208*a* above the metal substrate 200 are normally arranged so that they correspond in position to the die pads on the die 220. Since the distribution of die pads on the die 220 can have many types of configurations, the distribution of electroplate layers 208*a* as shown in FIG. 5 should not be used to limit the scope of the invention. FIG. 6 is a top view of the lower surface of the package according to this invention after a circuit line mask is formed over the metal substrate for a second type of external metal peg arrangement.

Figure 2H:
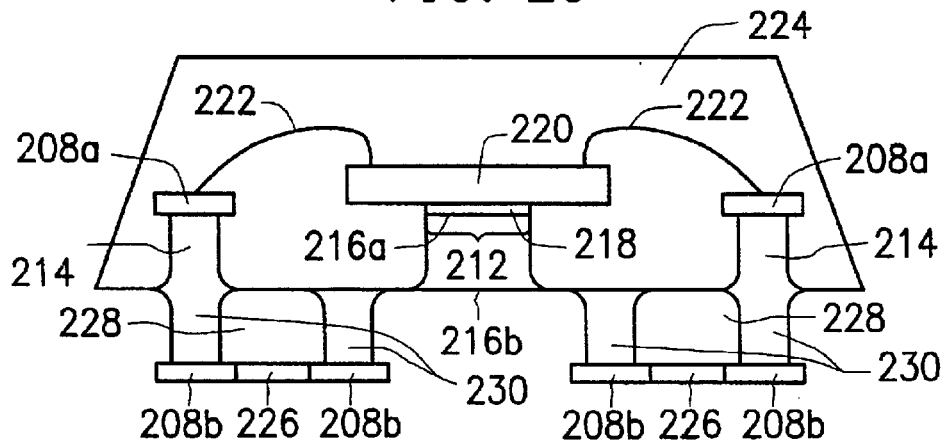

As shown in FIG. 2H, using the electroplate layers 208*b* and the circuit line mask 226 as an etching mask, the exposed surface 202*b* of the metal substrate 200 is etched. During the etching operation, a portion of the metal substrate 200 is removed exposing a portion of the insulating material 224 to form external metal pegs 230 and printed circuit lines 228. Hence, a package having an my of metal pegs connected by printed circuit lines is formed. After the etching operation, the die pad 212 has a profile with its lower surface 216*b* at the same level as the underside of the package. The metal external metal pegs 230 are electrically connected to the internal metal pegs 214 via the printed circuit lines 228 (not shown in FIG. 2H). Alternatively, the external metal pegs 230 and the internal metal pegs 214 can be electrically connected directly without the need of a circuit line.

As shown in FIG. 2H, the package structure of this invention includes at least a die pad 212 with a silicon die 220 on its upper surface 216*a*. The lower surface 216*b* of the die pad 212 is exposed. The external pegs 230 are positioned around the die pad 212 area forming an area array layout. One end of each internal metal peg 214 is buried inside the insulating material 224 of the package and is electrically connected to a bonding pad on the die 220. The other end of the metal peg 214 is connected to a printed circuit line 228 (not shown in FIG. 2H) so that the internal metal peg 214 is electrically connected to an external metal peg 230 via the circuit line 228 (not shown in FIG. 2H). However, an internal metal peg and an external metal peg 230 can also be electrically connected directly. In addition, the end face of each internal metal peg 214 has an electroplate layer 208*a*. Similarly, the end face of each external metal peg 230 also has an electroplate layer 208*b*. These electroplate layers 208*a* and 208*b* are convenient locations for carrying out electrical connection, molding and subsequent soldering process.

Figure 7:
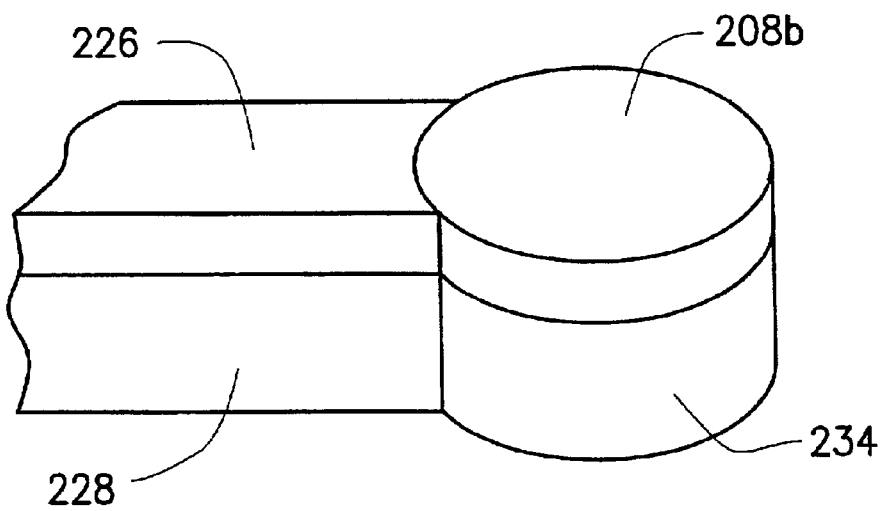
FIG. 7 is a schematic, perspective view showing a printed circuit line and bonding pad structure of a package fabricated according to the method of this invention.

FIG. 7 is a perspective view showing a printed circuit line and bonding pad structure of a package fabricated according to the method of this invention. As shown in FIG. 7, the printed circuit line 228 and the bonding pad 234 are connected together. The printed circuit line 228 is covered by the circuit line mask 226, and the upper surface of the bonding pad 234 is covered by the electroplate layer 208*b*. A cross-section of the printed circuit line 228 and the circuit line mask 226 is shown in FIG. 8A.

Figure 8A:
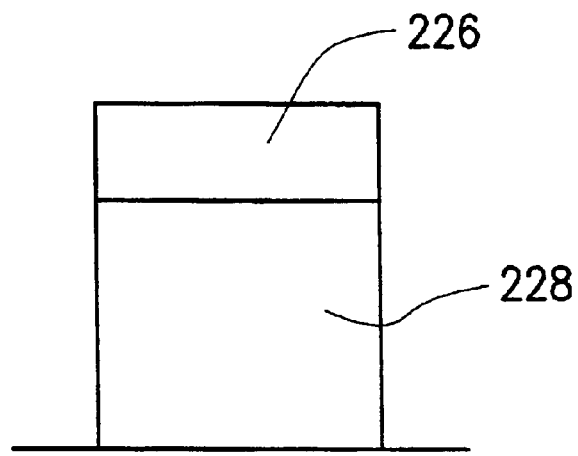
FIGS. 8A and 8B are schematic, cross-sectional views showing two different structural arrangement of the circuit line mask and the printed circuit line according to the method of forming the package structure in this invention.
Figure 8B:
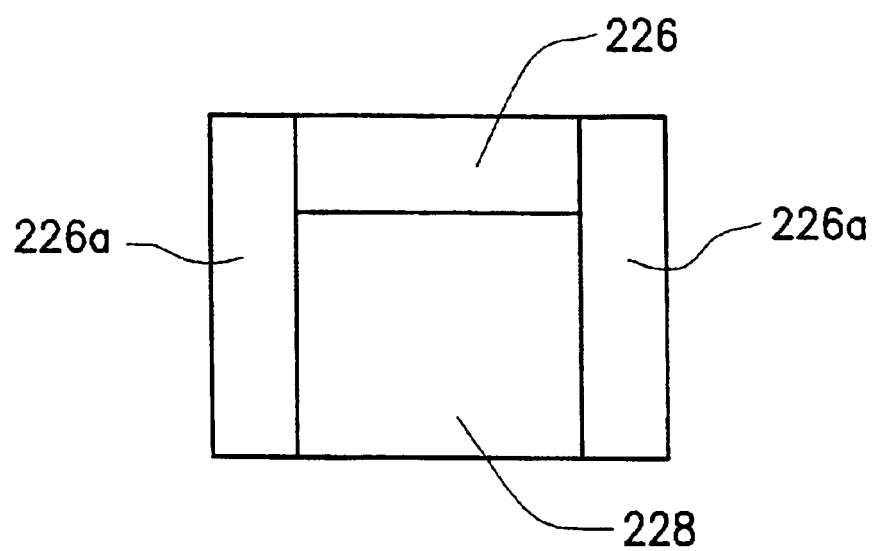

FIG. 8B illustrates schematic, cross-sectional views showing a structural arrangement of the circuit line mask and the printed circuit line that differs from FIG. 8A according to the method of forming the package structure in this invention. As shown in FIG. 8B, sidewall masks 226*a* are also formed on the sidewalls of the printed circuit line 228. In other words, the printed circuit line 228 is enclosed by the sidewalls masks 226*a* and the circuit line mask 226. Therefore, the possibility of damage is lowered while the degree of attachment with the insulating material is increased. The method of forming the sidewall masks 226*a* is very similar to the method for forming the circuit line mask 226. For example, a screen printing method can be used by first coating a layer of insulating paint on the sidewalls of the printed circuit line, and then baking to harden the paint.

Figure 2I:
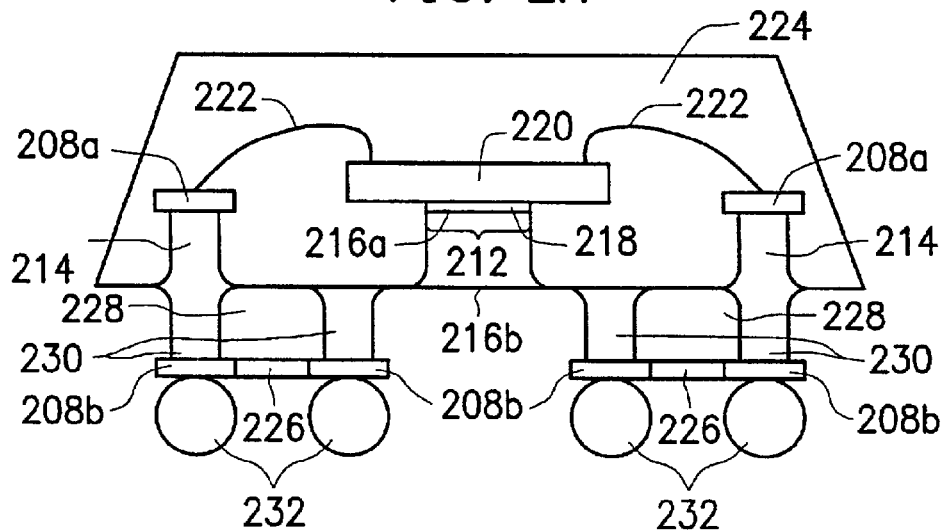

As shown in FIG. 2I, soldering material 232 can be deposited onto the electroplate layers 208*b* at the bottom side of the finished package. The soldering material 232 can serve as a medium for the subsequent connection of the IC package with a printed circuit board. The soldering material can be any conductive material such as solder paste, a solder ball or a copper ball. A ball grid array (BGA) structure is formed if a solder or copper ball is attached to each electroplate layer 208b. On the other hand, if solder paste is used, then a land grid array (LGA) structure is formed. Finally, the attached packages are separated using a method similar to separating silicon dies in a wafer.

In summary, major characteristics of this invention include the following:

1. The package of this invention utilizes metal pegs as external leads for connecting a die with external circuits. Since the metal pegs can be arranged to form an area array, level of integration for the package is increased. Furthermore, the metal pegs have better mechanical strength, and so are capable of increasing the reliability as well as the yield of such package.

2. Since a one-sided molding process is used in this invention, package thickness and hence its overall volume is minimized. Furthermore, the lower surface of the die pad is exposed after etching the exposed metal substrate on the bottom side of the package. Hence, the amount of heat dissipated from the die per unit time is increased.

3. The face at one end of the metal peg is covered by an electroplate layer that also serves as an etching mask. The metal pegs can have good bondability, molding compound characteristic and solderability if proper electroplate material is chosen. Consequently, both product yield and subsequent surface soldering capacity improves.

4. Solder balls or copper balls can be attached to or solder paste can be smeared on the terminal surface of the external metal pegs to form a ball grid array or a land grid array. Hence, the necessary electrical connection to a printed circuit board can be provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming an integrated circuit package that contains an array of metal pegs connected by printed circuit lines, comprising the steps of:

providing a metal substrate that has a first surface and a second surface;

forming a plurality of first electroplate layers on the first surface and forming a plurality of second electrode layers on the second surface;

forming a mask layer over the first surface to form a die pad region so that the first electroplate layers are positioned around the die pad region;

etching the exposed metal substrate on the first surface using the mask layer and the fist electroplate layers as an etching mask to form a die pad and a plurality of first metal pegs;

removing the mask layer;

attaching a silicon die onto the die pad, and connecting the die and the first electroplate layers electrically, wherein an area of the die pad region is smaller than an area of the die;

enclosing the die, the die pad, the first electroplate layers and the first metal pegs above the first surface of the metal substrate with an insulating material;

forming a plurality of circuit line masks on the second surface of the metal substrate; and etching the exposed metal substrate on the second surface using the second electroplate layers and the circuit line mask as an etching mask to form a plurality of second metal pegs and a plurality of printed circuit lines.

2. The method of claim 1, wherein the step of forming the first electroplate layers and the second electroplate layers further includes:

forming a first photoresist layer and a second photoresist layer over the first surface and the second surface of the metal substrate, respectively;

carrying out exposure and development operations with regards to the first and the second photoresist layers, respectively, so that a portion of the first surface and a portion of the second surface are exposed, thus defining a plurality of first metal pegs regions and a plurality of second metal pegs regions; and conducting an electroplating operation to form first electroplate layers and second electroplate layers over the first metal peg regions and the second metal peg regions, respectively.

3. The method of claim 2, wherein after the step of forming the first electroplate layers and the second electroplate layers, but before the step of forming the mask layer, further includes removing the first photoresist layer.

4. The method of claim 1, wherein the step of forming the first electroplate layers includes electroplating a material chosen from a group consisting of gold, silver, nickel, palladium and a combination of them.

5. The method of claim 1, wherein the step of forming the second electroplate layer includes electroplating gold, silver, nickel, palladium or a combination of them.

6. The method of claim 1, wherein the step of forming the mask layer includes:

forming a photoresist layer over the first surface of the metal substrate; and exposing the photoresist layer and developing the photoresist layer to form the mask layer.

7. The method of claim 1, wherein the step of forming the circuit line masks includes using a screen printing method.

8. The method of claim 1, wherein after the step of forming the printed circuit lines, further includes forming a plurality of sidewall masks on the sidewalls of the circuit lines.

9. The method of claim 8, wherein the step of forming the sidewall masks includes using a screen printing method.

10. The method of claim 1, wherein after the step of forming the printed circuit lines, further includes attaching a solder ball to the surface of each second electroplate layer.

11. The method of claim 1, wherein after the step of forming the printed circuit lines, further includes attaching a copper ball to the surface of each second electroplate layer.

12. The method of claim 1, wherein after the step of forming the printed circuit lines, further includes smearing solder paste over the surface of each second electroplate layer.

13. The method of claim 1, wherein the die, the die pad, the first electroplate layers and the first metal pegs above the first surface of the metal substrate are enclosed in one molding operation.

* * * * *